(12) United States Patent
Wang et al.

(10) Patent No.: US 8,498,118 B2
(45) Date of Patent: Jul. 30, 2013

(54) MOUNTING ASSEMBLY FOR HEAT DISSIPATING DEVICE

(75) Inventors: Tao Wang, Shenzhen (CN); Jian Fu, Shenzhen (CN); Zhi-Jiang Yao, Shenzhen (CN); Li-Fu Xu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 222 days.

(21) Appl. No.: 13/118,070

(22) Filed: May 27, 2011

(65) Prior Publication Data

US 2012/0106080 A1    May 3, 2012

(30) Foreign Application Priority Data

Oct. 27, 2010  (CN) .......................... 2010 1 0521530

(51) Int. Cl.
*H05K 7/20* (2006.01)
(52) U.S. Cl.
USPC ...... 361/719; 361/679.54; 361/704; 361/709; 361/710; 165/80.3; 165/104.33; 165/185; 257/718; 257/722; 257/727; 24/458
(58) Field of Classification Search
USPC ............... 361/679.46, 679.54, 704–712, 715, 361/719–727; 165/80.2, 80.3, 104.33, 185; 257/706–727; 174/15.1, 16.3, 252; 29/890.02, 29/890.03, 823, 592.1; 24/453, 457, 458, 24/588, 589, 981; 248/505, 506, 510, 71; 411/173, 511, 516, 520, 522, 530
See application file for complete search history.

(56) References Cited

U.S. PATENT DOCUMENTS

| | | | | |
|---|---|---|---|---|
| 6,037,660 A * | 3/2000 | Liu | ................................ | 257/722 |
| 6,518,507 B1 * | 2/2003 | Chen | ............................ | 174/252 |
| 6,768,641 B2 * | 7/2004 | Li | .................................. | 361/719 |
| 6,947,283 B2 * | 9/2005 | Hsieh et al. | .................... | 361/703 |
| 7,142,429 B2 * | 11/2006 | Hsieh et al. | .................... | 361/710 |
| 7,167,369 B1 * | 1/2007 | Huynh et al. | ................. | 361/719 |
| 7,203,066 B2 * | 4/2007 | Lee et al. | ...................... | 361/704 |
| 7,518,874 B2 * | 4/2009 | Deng et al. | ..................... | 361/710 |
| 7,639,501 B2 * | 12/2009 | Wang et al. | .................... | 361/704 |
| 7,672,136 B2 * | 3/2010 | He et al. | ........................ | 361/719 |
| 7,990,718 B2 * | 8/2011 | Xia et al. | ....................... | 361/710 |
| 2004/0001315 A1 * | 1/2004 | Li | .................................. | 361/697 |
| 2004/0062007 A1 * | 4/2004 | Hsieh et al. | .................... | 361/703 |
| 2005/0094377 A1 * | 5/2005 | Lee et al. | ...................... | 361/704 |
| 2006/0012960 A1 * | 1/2006 | Hsieh et al. | .................... | 361/703 |
| 2007/0115642 A1 * | 5/2007 | Ho | ................................ | 361/710 |
| 2009/0009972 A1 * | 1/2009 | Ho | ................................ | 361/704 |
| 2009/0040729 A1 * | 2/2009 | Deng et al. | ..................... | 361/710 |
| 2009/0154109 A1 * | 6/2009 | Chen et al. | ..................... | 361/709 |
| 2010/0128440 A1 * | 5/2010 | Li et al. | ......................... | 361/709 |
| 2010/0259902 A1 * | 10/2010 | Xia et al. | ....................... | 361/720 |
| 2010/0314073 A1 * | 12/2010 | Zhao et al. | .................... | 165/80.3 |

* cited by examiner

*Primary Examiner* — Michail V Datskovskiy
(74) *Attorney, Agent, or Firm* — Altis Law Group, Inc.

(57) ABSTRACT

A mounting assembly includes a circuit board, a securing member and a heat dissipating device. A retainer is located on the circuit board. The securing member includes a positioning portion and a claw connected to the positioning portion. The heat dissipating device includes a base attached to the circuit board and a number of fins perpendicularly located on the base. The number of fins defines a number of first air paths and a number of second air paths substantially perpendicular to the number of first air paths. The positioning portion is received in at least one of the number of first air paths and at least one of the number of second air paths, and the claw is engaged with the retainer.

17 Claims, 7 Drawing Sheets

MOUNTING ASSEMBLY FOR HEAT DISSIPATING DEVICE

BACKGROUND

1. Technical Field

The present disclosure relates to a mounting assemblies, and particularly, to a mounting assembly for a heat dissipating device.

2. Description of Related Art

Electronic devices generate heat when in use. Electronic components of the electronic devices may be damaged if overheated. A fan and a heatsink are often provided in electronic devices to remove heat away from the electronic components. Generally, the heatsink includes a base adhered to one of the components, and a plurality of fins perpendicularly mounted on the base. In different chassis, the heatsink needs to be secured to components in different ways or orientations, which can be inconvenient.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
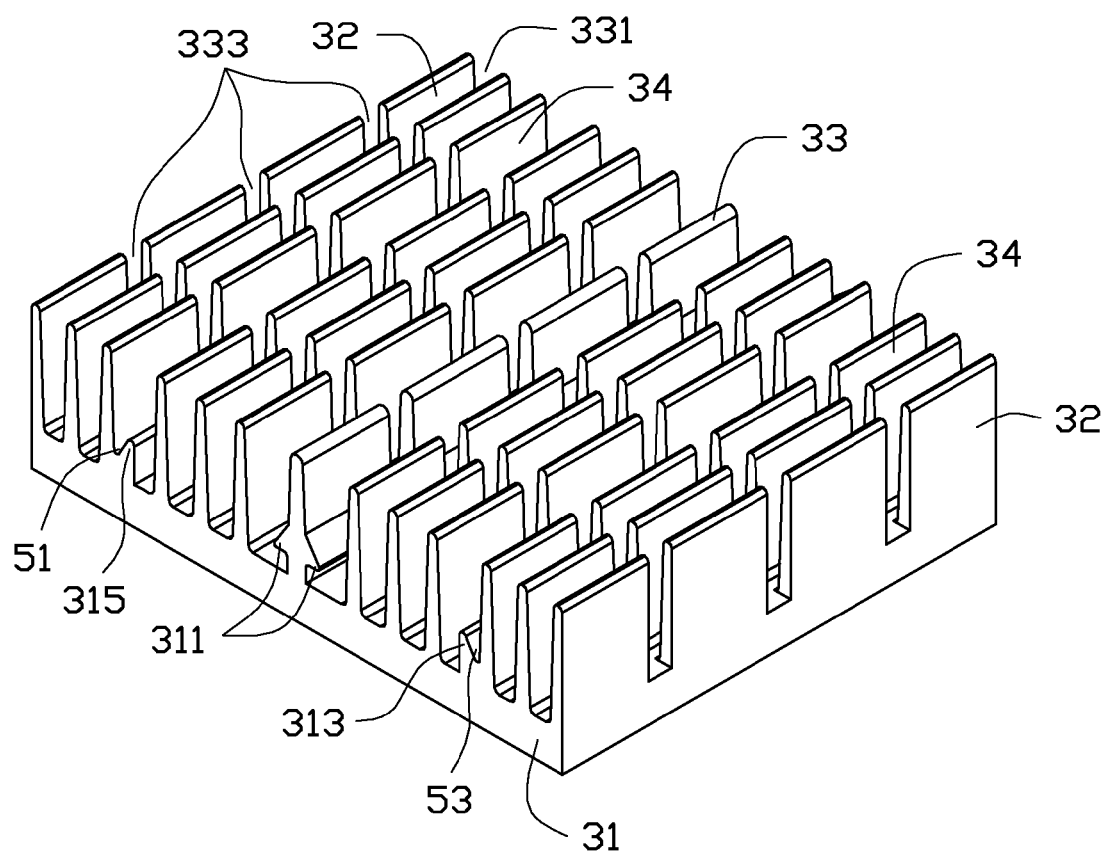
FIG. 1 is an isometric view of a heat dissipating device in accordance with an embodiment.
Figure 2:
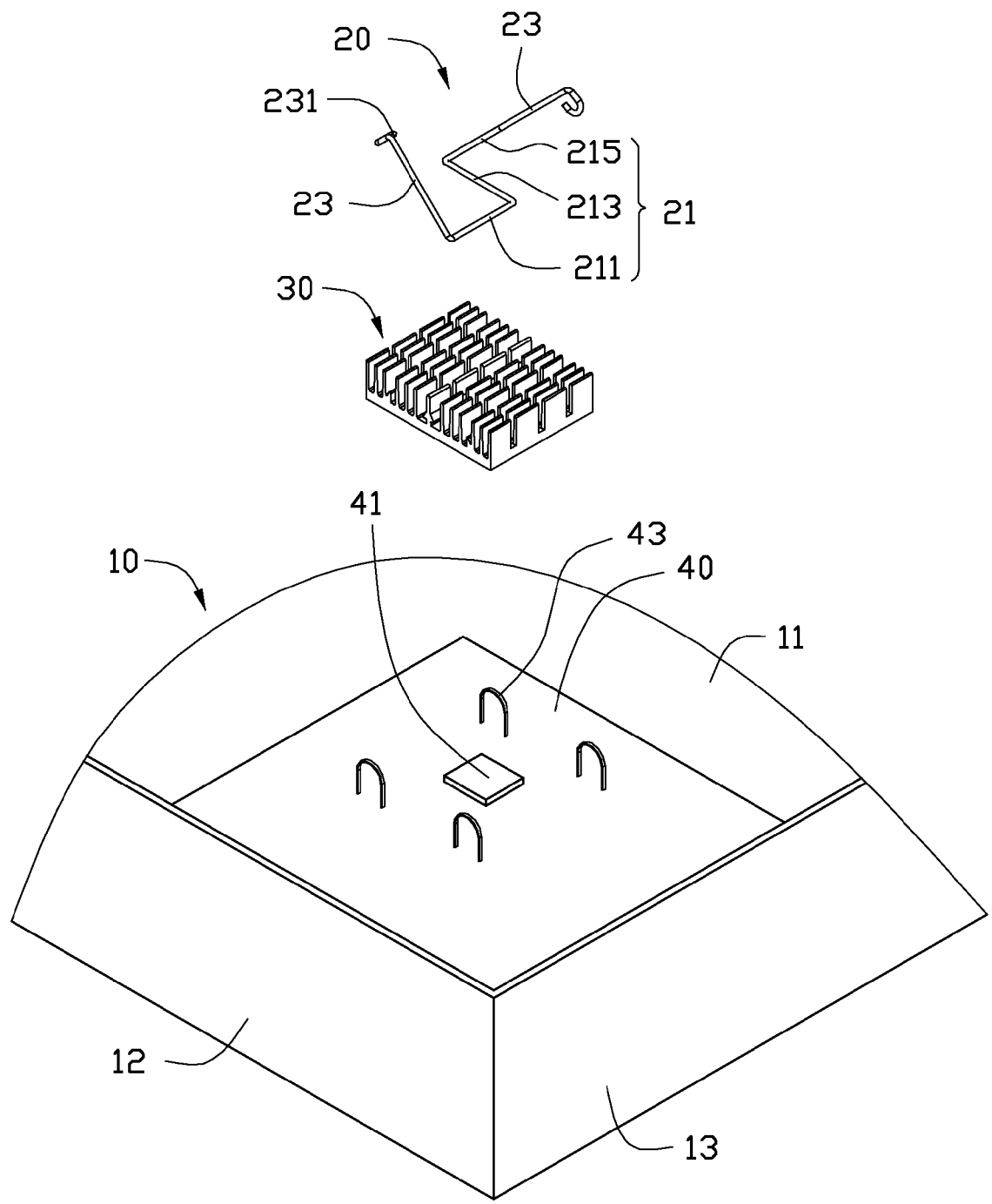
FIG. 2 is a partially exploded, isometric view of the mounting assembly with a first securing member in accordance with an embodiment.

Referring to FIGS. 1 and 2, a mounting assembly in accordance with an embodiment includes an electronic device enclosure 10, such as a computer enclosure, and a heat dissipating device 30 mounted in the electronic device enclosure 10.

The electronic device enclosure 10 includes a bottom wall 11, a first sidewall 12 and a second sidewall 13. In one embodiment, the first sidewall 12 is substantially perpendicular to the bottom wall 11 and the second sidewall 13.

A circuit board 40 is attached to the bottom wall 11, and an electronic component 41 (e.g. a chip) is attached to the circuit board 40. Four retainers 43 are located on the circuit board 40 at four corners of a rectangular area. The electronic component 41 is secured to the circuit board 40 among the four retainers 43.

The heat dissipating device 30 includes a base 31 and a plurality of fins located on the base 31. In one embodiment, the fins are substantially rectangular-shaped and perpendicular to the base 31. The fins are placed in an array and cooperatively define a plurality of first air paths 331 and three second air paths 333. In one embodiment, the plurality of first air paths 331 is substantially parallel to a side of the base 31, and the three second air paths 333 are substantially perpendicular to the first air paths 331. The plurality of fins includes two first fins 32 located at opposite sides of the base 31, a second fin 33 located at the center of the base 31, and two third fins 34, respectively located between the second fin 33 and the first fins 32.

Two clasping portions 311 are located at opposite sides of the second fin 33. A first hook 313 and a second hook 315, are located on the two third fins 34. A first gap 51 is defined between the first hook 313 and one of the third fins 34, and a second gap 53 is defined between the second hook 315 and the other of the third fins 34. In one embodiment, each clasping portion 311 is triangular, the second hooks 315 are also triangular and have the same configuration as the first hook 313. One of ordinary skill in the art will also realize that by this disclosure the clasping portion 311 and the first and second hooks 313, 315 are not limited to the present configuration. Rather, other configurations can be used in other embodiments, for example, the clasping portion 311, and the first and second hooks 313, 315 can be L-shaped.

The first and second hooks 313, 315 are arranged in the first air paths 331. Four of the first air paths 331 receive the clasping portions 311, and the first and second hooks 313, 315 and have widths greater than the widths of the other first air paths 331. The three second air paths 333 divide the plurality of fins into four symmetrical portions.

Figure 3:
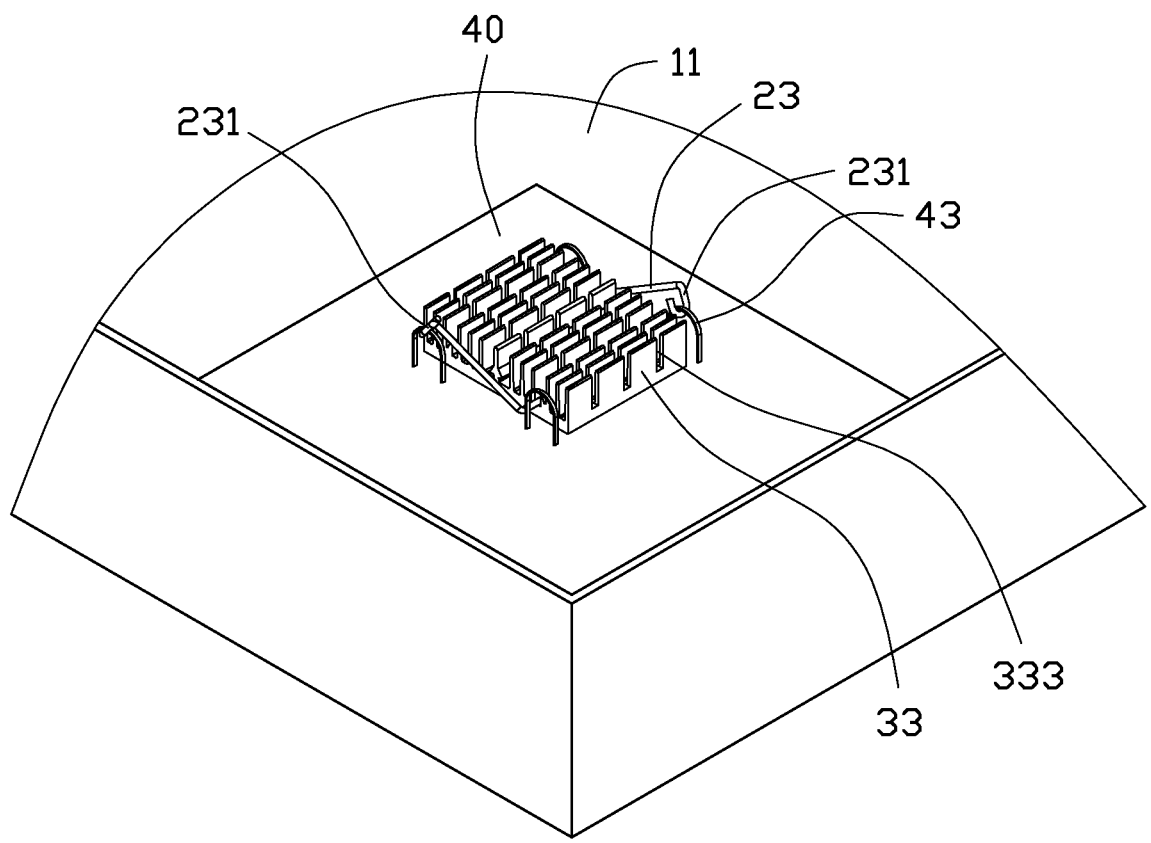
FIG. 3 is an assembled view of FIG. 2.
Figure 4:
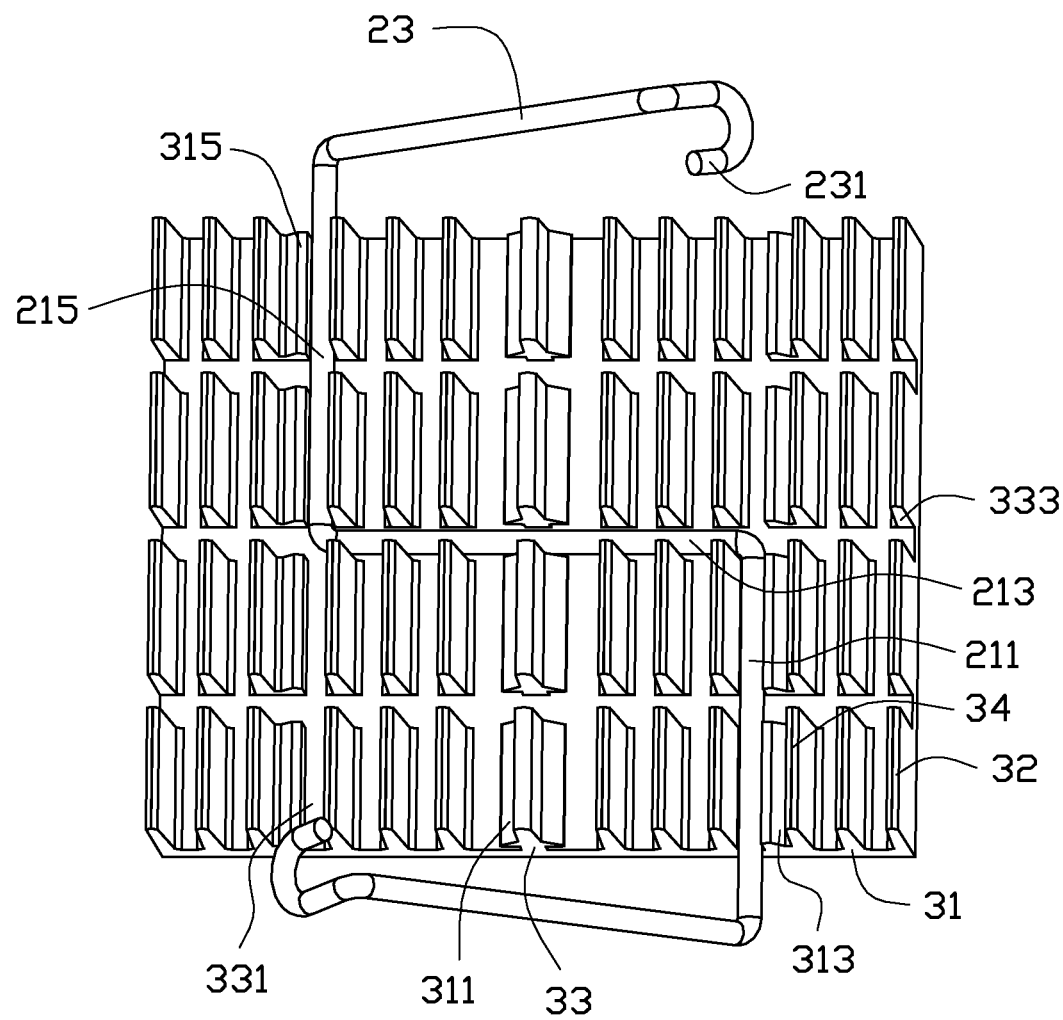
FIG. 4 is a top view of FIG. 3, with only the first securing member and the heat dissipating device are shown.

Referring also to FIGS. 2-4, a first securing member 20 is provided to secure the heat dissipating device 30 to the circuit board 40. The first securing member 20 includes a first positioning portion 21 and two extending arms 23 connected to two opposite ends of the first positioning portion 21 respectively. The first positioning portion 21 includes a first shaft 211, a second shaft 213, and a third shaft 215. The first shaft 211 extends from the second shaft 213 in a first direction, and the third shaft 215 extends from the second shaft 213 in a second direction, that is opposite to the first direction. Two first claws 231, corresponding to the retainers 43, respectively extend from the free end of each extending arm 23. In one embodiment, the length of the second shaft 211 is equal to that of the third shaft 215, and equal to half of length of each fin, and the length of the first shaft 211 is equal to a distance between the first hook 313 and the second hook 315.

In assembly, the first securing member 20 is received in the first and second air paths 331, 333. The first shaft 211 is engaged with the first hook 313, the second shaft 213 is received in the middle of the three second air path 333, and the third shaft 215 is engaged with the second hook 315. Therefore, the two extending arms 23 extend out of the base 31, and the two claws 231 are engaged with the two diagonal retainers 43 of the four retainers 43.

Figure 5:
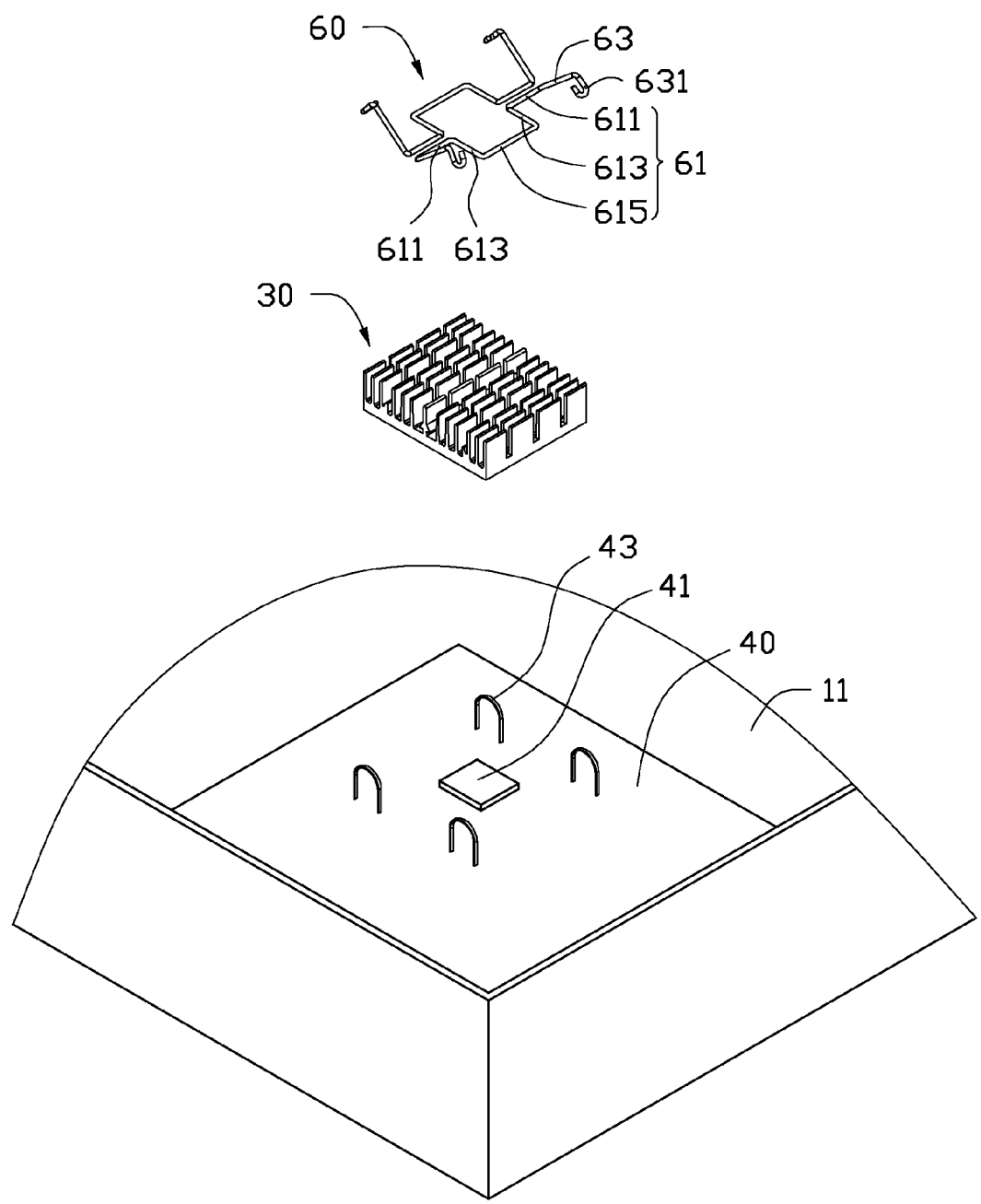
FIG. 5 is a partially exploded, isometric view of the mounting assembly with two second securing members in accordance with an embodiment.
Figure 6:
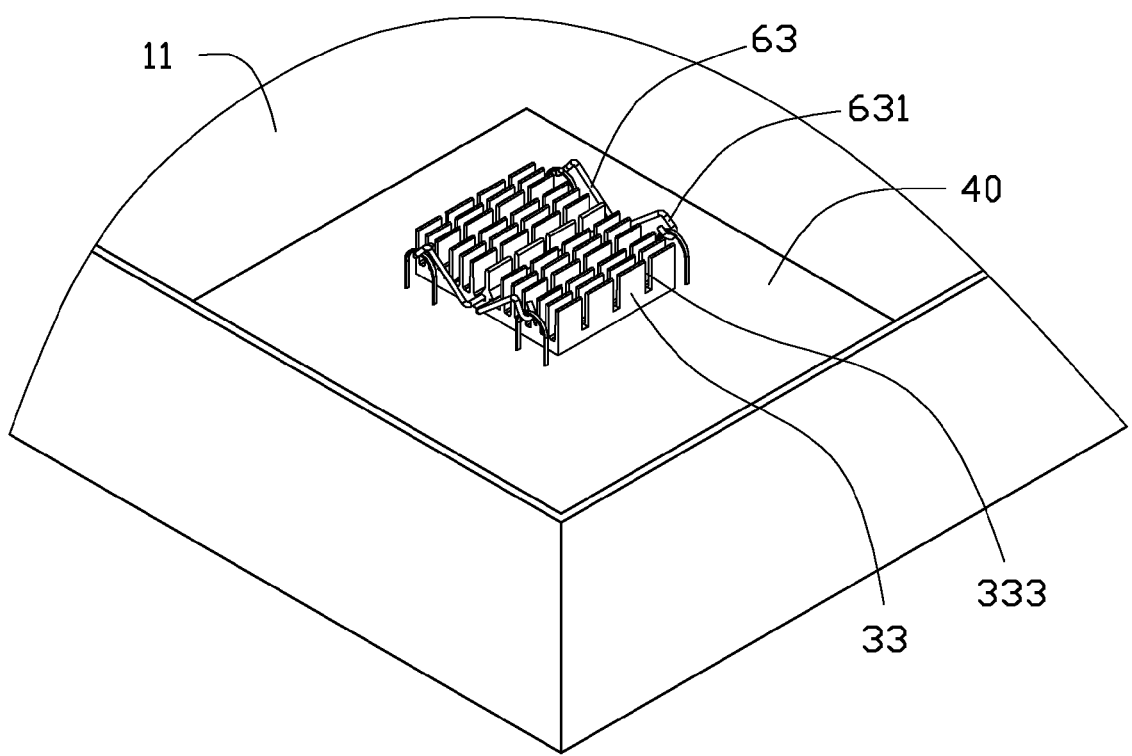
FIG. 6 is an assembled view of FIG. 5.
Figure 7:
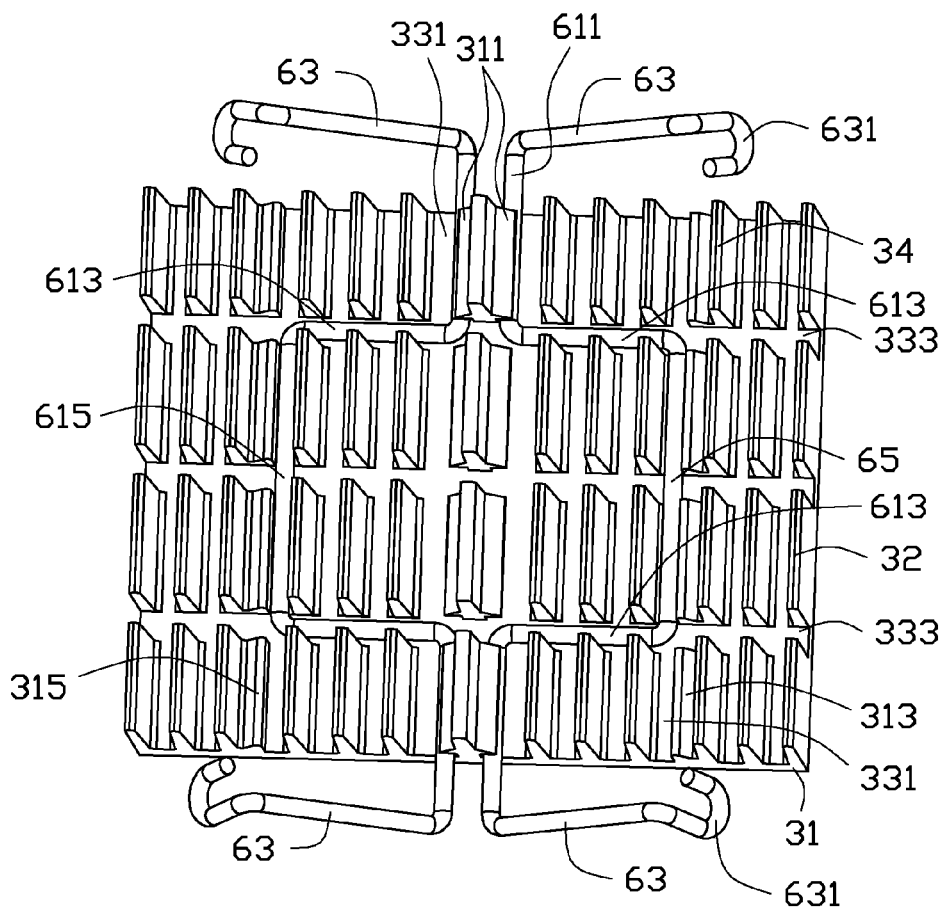
FIG. 7 is a top view of FIG. 6, with only the two second securing members and the heat dissipating device are shown.

Referring also to FIGS. 5-7, two second securing members 60 are provided to secure the heat dissipating device 30 to the circuit board 40. Each second securing member 60 includes a second positioning portion 61 and two connecting portions 63 respectively extending from the opposite ends of the retaining portion 61. The second positioning portion 61 includes two first poles 611, respectively connected to the connecting portions 63, two second poles 613, respectively connected to the two first poles 611, and a third pole 615 located between the two second poles 613. In one embodiment, the two second poles 613 are substantially parallel to each other, and perpendicular to the first and third poles 611, 615. Two second claws 631, corresponding to the retainer 43, are respectively located at a free end of each connecting portion 63. In one embodiment, the length of the first pole 611 is substantially equal to a distance between the first hook 313 and the clasping portion 311 and also equal to a distance between the second hook 315 and the clasping portion 311. The length of the third pole 615 is substantially equal to a distance between the two second air paths 333 located at the opposite sides of the center second air path 333.

In assembly, each second securing member 60 is received in the first and second air paths 331, 333. The two first poles 611 of each second securing member 60 are engaged with the two clasping portions 311, the two second poles 613 of each securing member 60 are received in the second air paths 333, and the third pole 615 of each securing member 60 is engaged with the first hook 313 (second hook 315). Therefore, the connecting portions 63 are located the opposite sides of the base 31, and the four second claws 631 of the two second securing members 63 are engaged with the four retainers 43.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A mounting assembly comprising:
   a circuit board; a retainer located on the circuit board;
   a securing member comprising a positioning portion and a claw connected to the positioning portion; and
   a heat dissipating device comprising a base attached to the circuit board and a plurality of fins located on the base, the base comprising a top surface connected to the plurality of fins; a hook extending from the top surface, and a gap defined between the hook and one of the plurality of fins adjacent to the hook; the plurality of fins defining a plurality of first air paths and a plurality of second air paths substantially perpendicular to the plurality of first air paths;
   wherein the positioning portion is received in at least one of the plurality of first air paths and at least one of the plurality of second air paths and engaged in the gap, and the claw is engaged with the retainer.

2. The mounting assembly of claim 1, wherein a width of the at least one of the plurality of first air paths is greater than that of the other of the plurality of first air paths.

3. The mounting assembly of claim 2, wherein the positioning portion comprises a first shaft engaged with the hook, and the first shaft is received in the at least one of the plurality of first air paths.

4. The mounting assembly of claim 3, wherein the positioning portion further comprises a second shaft connected to the first shaft, and the second shaft is received in at least one of the plurality of second air paths.

5. The mounting assembly of claim 4, wherein the positioning portion further comprises a third shaft, the first shaft extends from the second shaft in a first direction, and the third shaft extends from the second shaft in a second direction, that is opposite to the first direction.

6. The mounting assembly of claim 4, wherein the first shaft is substantially perpendicular to the second shaft.

7. The mounting assembly of claim 1, wherein the securing member further comprises an extending arm connected to the positioning portion, and the extending arm is located outside of the base.

8. A mounting assembly comprising:
   a circuit board; a retainer located on the circuit board;
   a securing member comprising a positioning portion and a claw connected to the positioning portion; and
   a heat dissipating device comprising a base attached to the circuit board and a plurality of fins located on the base, the base comprising a top surface connected to the plurality of fins; a hook extending from the top surface, and a gap defined between the hook and one of the plurality of fins adjacent to the hook; a clasping portion extending from one of the plurality of fins and above the base; the plurality of fins defining a plurality of first air paths and a plurality of second air paths that are perpendicular to the plurality of first air paths;
   wherein the claw is engaged with the retainer, and the positioning portion is received between a first station, where the positioning portion is received in the two of the plurality of first air paths and engaged with the hook, and a second station, where the positioning portion is received in the two of the plurality of second air paths and engaged with the clasping portion.

9. The mounting assembly of claim 8, wherein a width of the one of the plurality of first air paths is greater than that of the other of the plurality of first air paths.

10. The mounting assembly of claim 9, wherein the positioning portion comprises a first shaft engaged with the hook, and the first shaft is received in the one of the plurality of first air paths.

11. The mounting assembly of claim 10, wherein the positioning portion further comprises a second shaft connected to the first shaft, and the second shaft is received in the one of the plurality of second air paths.

12. The mounting assembly of claim 11, wherein the positioning portion further comprises a third shaft, the first shaft extends from the second shaft in a first direction, and the third shaft extends from the second shaft in a second direction, that is opposite to the first direction.

13. The mounting assembly of claim 8, wherein the securing member further comprises an extending arm connected to the positioning portion, and the extending arm is located outside of the base.

14. The mounting assembly of claim 8, wherein the securing member further comprises a extending arm extending from the positioning portion, and the claw is located on the connecting portion.

15. The mounting assembly of claim 14, wherein the positioning portion comprises two first poles, two second poles, and a third pole located between the two second poles; and the two first poles are engaged with the clasping portion, the two second poles are received in two of the plurality of second air paths, and the third pole is engaged with the hook.

16. The mounting assembly of claim 15, wherein each first poles is substantially parallel to the third pole.

17. The mounting assembly of claim 15, wherein the two second poles are substantially parallel to each other, and each second pole is substantially perpendicular to each first poles and the third pole.

* * * * *